(12) United States Patent
Ha

(10) Patent No.: US 9,811,629 B2
(45) Date of Patent: Nov. 7, 2017

(54) CIRCUIT INFORMATION GENERATING APPARATUS AND CIRCUIT INFORMATION GENERATING SYSTEM

(71) Applicant: Kilseong Ha, Kanagawa (JP)

(72) Inventor: Kilseong Ha, Kanagawa (JP)

(73) Assignee: Kilseong Ha, Kanagawsa (JP)

( * ) Notice: Subject to any disclaimer, the term of this patent is extended or adjusted under 35 U.S.C. 154(b) by 0 days.

(21) Appl. No.: 15/165,674

(22) Filed: May 26, 2016

(65) Prior Publication Data
US 2016/0350471 A1 Dec. 1, 2016

(30) Foreign Application Priority Data

May 27, 2015 (JP) ................................. 2015-107083
May 10, 2016 (JP) ................................. 2016-094327

(51) Int. Cl.
*G06F 17/50* (2006.01)
(52) U.S. Cl.
CPC ........ *G06F 17/5081* (2013.01); *G06F 17/505* (2013.01); *G06F 17/5077* (2013.01); *G06F 2217/14* (2013.01)
(58) Field of Classification Search
CPC .......................... G06F 17/5081; G60F 17/5077
USPC .......................................... 320/126; 716/126
See application file for complete search history.

(56) References Cited

U.S. PATENT DOCUMENTS

| | | | | |
|---|---|---|---|---|
| 4,984,195 A | * | 1/1991 | Nakamura et al. | ... G06F 13/405 710/25 |
| 7,860,582 B2 | * | 12/2010 | Ghercioiu et al. | ...... G06F 1/183 361/724 |

FOREIGN PATENT DOCUMENTS

JP 5-152705 A 6/1993

\* cited by examiner

*Primary Examiner* — Sun Lin
(74) *Attorney, Agent, or Firm* — Whitham, Curtis & Cook

(57) ABSTRACT

A circuit information generating apparatus includes a switching section that switches wiring between a base module and an extension module, an address acquisition section acquiring identification information of the extension module, a wiring information acquisition section, a firmware acquisition section acquiring firmware that operates the extension module, a wiring information rewriting section identifying circuit configuration information of each extension module based on the identification information, and rewrites a part of the wiring information based on the circuit configuration information, a circuit information generating section generating circuit information based on the circuit configuration information of the extension module and the rewritten wiring information, and a firmware generating section rewrites definition information of the wiring included in the firmware, based on the rewritten wiring information, and generates information indicating a circuit configuration of an electronic circuit configured using the extension module connected with the base module and serving a specific function.

6 Claims, 14 Drawing Sheets

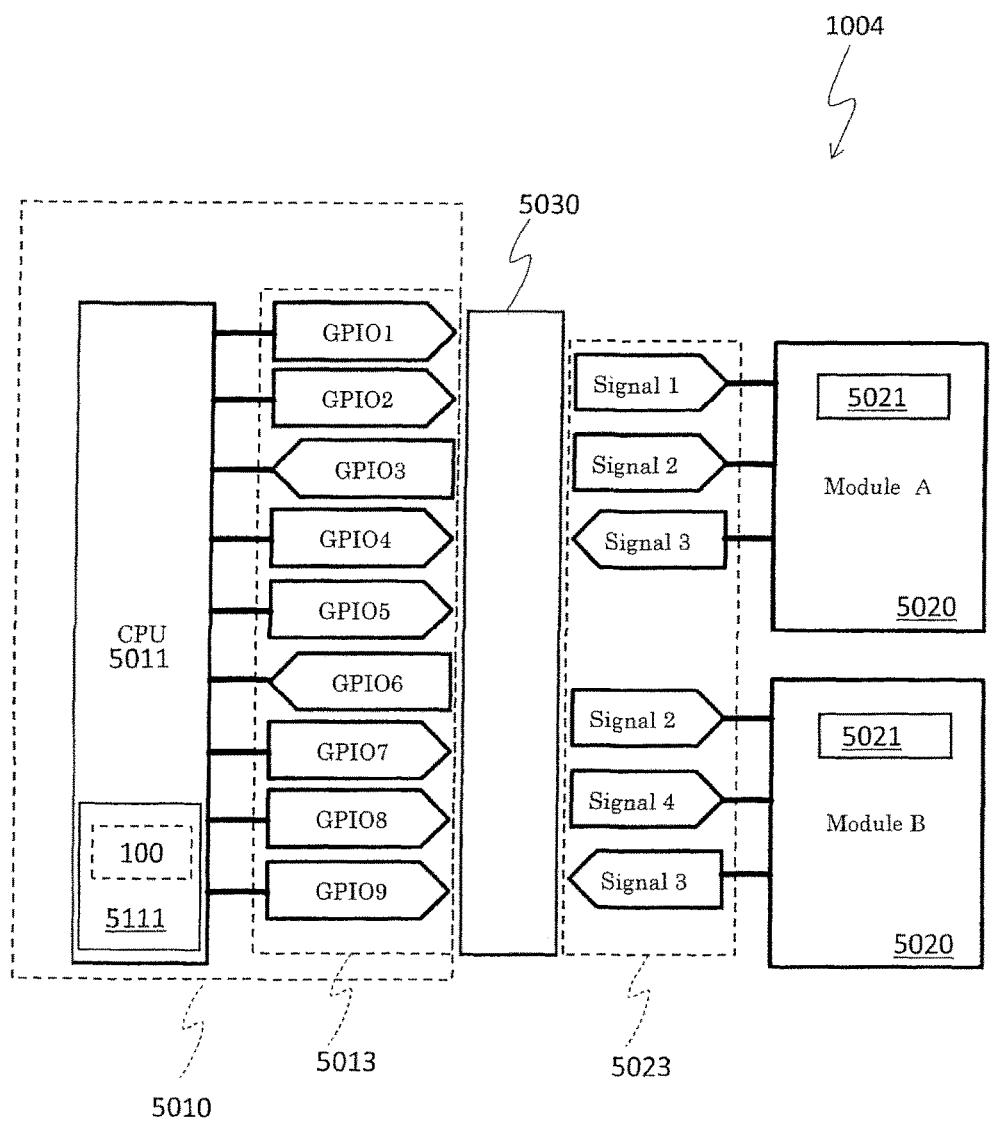
F I G. 5

121

```
#define signal1 = GPIO5;
#define signal2 = GPIO8;
#define signal3 = GPIO6;
#define signal4 = GPIO9;
          .
          .
          .
          .

Module_A = set_IOs(module_A_address, signal1, signal2, signal3);
Module_B = set_IOs(module_B_address, signal2, signal4 signal3);
```

F I G. 6

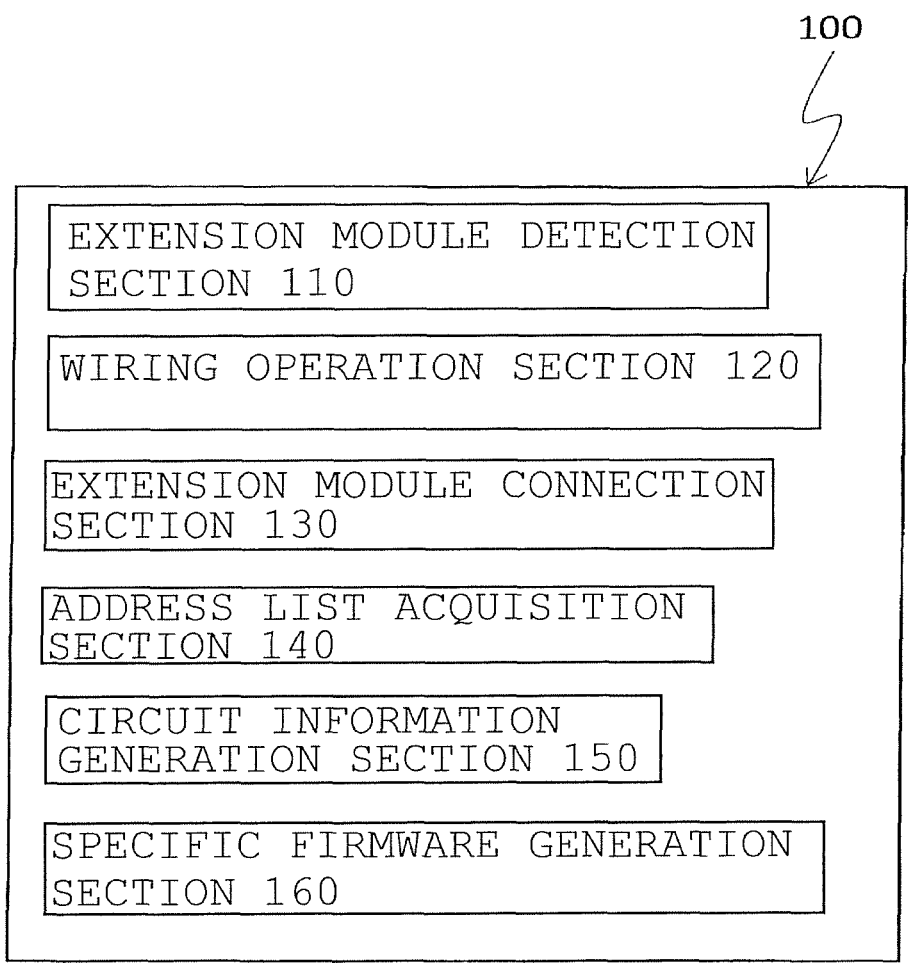
F I G. 7

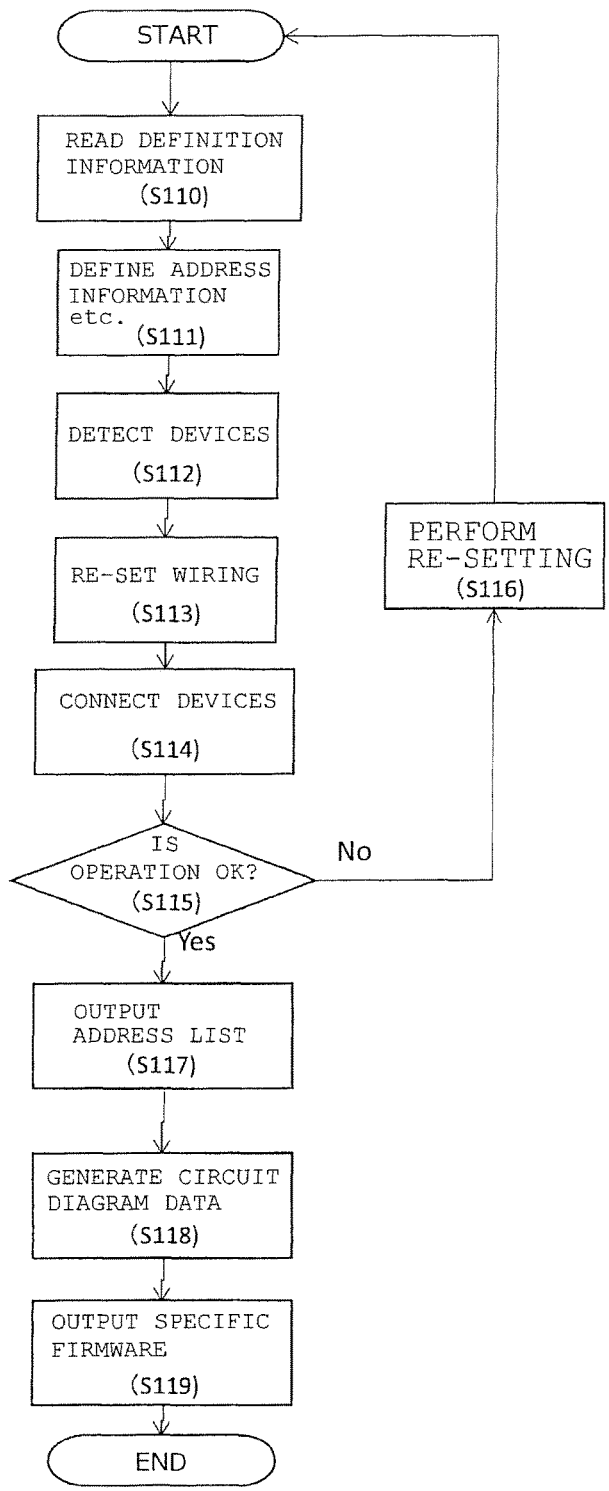
F I G. 8

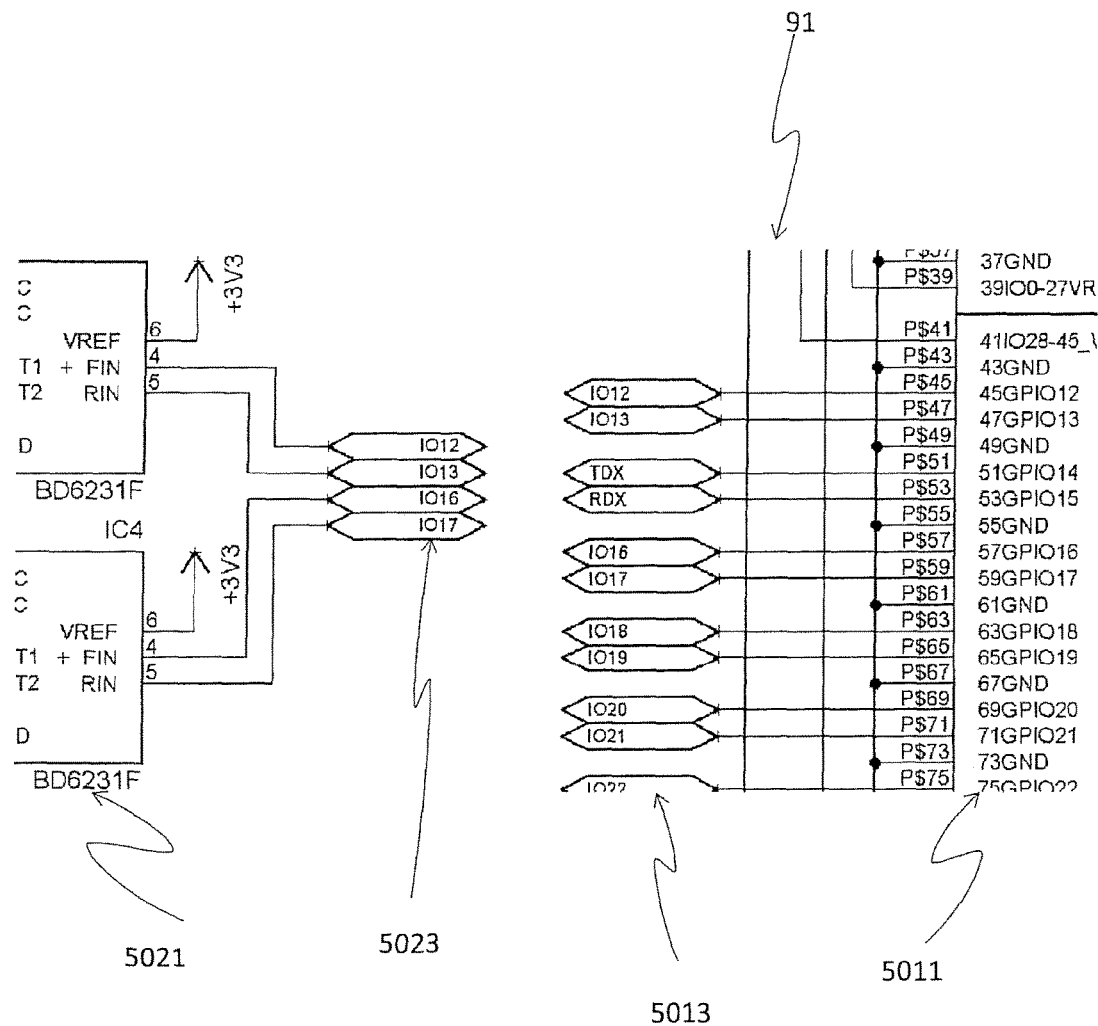
F I G. 9

```
#!/usr/bin/python

#SPI bus
MISO = 9
MOSI = 10
SCLK = 11
CE0 = 8
CE1 = 7

#I2C bus
SDA = 2
SCL = 3

#UART
Tx = 14
Rx = 15

NC = 0 io = [4,17,18,27,22,23,24,25,6,13,19,26,21,20,16,12]
inpin = [io[0],io[1],io[2],io[3],io[4],io[5]] #input pin setting
 [You can change Maximum number and Pin number]
outpin = [io[6],io[7],io[8],io[9],io[10],io[11],io[12],io[13],io[14],io[15]]#output pin setting
 [You can change Maximum number and Pin number]

pcbOutput = [4,17,18,27,22,23,24,25,6,13,19,26,21,20,16,12]
pcbInput = [4,17,18,27,22,23,24,25,6,13,19,26,21,20,16,12]
```

121

```
def getWiring(myAddress):
    if myAddress == 1:
        IOdata = [ outpin[0], outpin[1], outpin[3], outpin[4]]
    elif myAddress == 2:
        IOdata = [ inpin[0], inpin[1]]
    elif myAddress == 3:
        IOdata = [outpin[0],inpin[0],outpin[2]]
    elif myAddress == 4:
        IOdata = [CE1,inpin[0]]
    elif myAddress == 5:
        IOdata = [CE1]

return IOdata def initIO():

GPIO.setmode(GPIO.BCM)

for var in range(0,len(inpin)-1):
        GPIO.setup(inpin[var], GPIO.IN) #set inpin as a input for var in range(0,len(outpin)-1):
        GPIO.setup(outpin[var], GPIO.OUT) #set outpin as a output
```

FIG. 11

```
#!/usr/bin/python
import p
import RPi.GPIO as GPIO def getWiring(myAddress):
    if myAddress == 1:
        IOdata = [pcbOutput[0], pcbOutput[1], pcbOutput[2], pcbOutput[3]]
    elif myAddress == 3:
        IOdata = [pcbOutput[4], pcbInput[5], pcbOutput[6]]
    elif myAddress == 4:
        IOdata = [CE1, pcbInput [7]]

def initIO():

GPIO.setmode(GPIO.BCM)

GPIO.setup(p.pcbOutput[0], GPIO.OUT)
    GPIO.setup(p.pcbOutput[1], GPIO.OUT)
    GPIO.setup(p.pcbOutput[2], GPIO.OUT)
    GPIO.setup(p.pcbOutput[3], GPIO.OUT)
    GPIO.setup(p.pcbOutput[4], GPIO.OUT)
    GPIO.setup(p.pcbOutput[6], GPIO.OUT)

GPIO.setup(p.pcbInput[5], GPIO.IN)
    GPIO.setup(p.pcbInput[7], GPIO.IN)
```

FIG.12

CIRCUIT INFORMATION GENERATING APPARATUS AND CIRCUIT INFORMATION GENERATING SYSTEM

BACKGROUND OF THE INVENTION

Technical Field

The present invention relates to a circuit information generating apparatus and a circuit information generating system that automatically generates information to be used for mass production of an experimentally produced electronic circuit.

Background Art

When an electronic circuit that serves a specific function is developed using a microcomputer, a circuit configuration for serving the function is experimentally produced in advance, and an appropriate circuit configuration is built while operation confirmation is performed. In this experimental production stage, as a tool for assisting work, an experimental production tool including a base board including a signal processing unit such as the microcomputer and an extension module connected with the base board to serve the specific function is known.

This experimental production tool uses a wire or a connector for connection between the microcomputer (signal processing unit) mounted on the base board and the extension module. In a case of using the wire, one end of the wire is soldered to an individual terminal of the microcomputer included in the base board, and the other end of the wire is soldered to a terminal of the extension module. In a case of using the connector, a connector terminal is arranged between the base board and the extension module, and connects mutual connectors.

Experimental production work of the electronic circuit is work to combine various extension boards and confirm an operation, and confirm a circuit configuration that serves a desired specific function. Therefore, the extension modules may be replaced at the function confirmation stage, and thus it is desirable to easily change the connection between the extension boards and the base board. JP 05-152705 A describes an example of a connection structure that enables easy attachment/detachment of the base board and the extension modules. JP 05-152705 A describes a structure that connects connection boards mutually layered in parallel and a plurality of component boards arranged in a direction perpendicular to the connection boards with a plurality of connection elements.

There is still a problem to efficiently experimentally produce the electronic circuit even if the base board and the extension modules are connected using the structure described in JP 05-152705 A. That is, to mass produce an electronic circuit having the same configuration as the experimentally produced electronic circuit, a circuit diagram for mass production that configures the electronic circuit as minimally as possible without unnecessary components is required. Further, firmware is also required to operate the manufactured electronic circuit. However, a conventional experimental production tool cannot generate the circuit diagram of the electronic circuit and the firmware from the electronic circuit after the experimental production, and also cannot generate firmware in accordance with the circuit diagram for mass production or the circuit diagram. Further, in the conventional experimental production tool, many unnecessary components such as switching remain attached in the electronic circuit after the experimental production. Further, in the conventional experimental production tool, various pieces of information required in processes after the experimental production need to be separately generated.

SUMMARY OF INVENTION

An object of the present invention is to provide a circuit information generating apparatus and a circuit information generating system that can automatically generate circuit diagram information to be used to generate a circuit diagram for mass production having a minimum configuration without unnecessary components, of an experimentally produced electronic circuit, and can also automatically generate firmware to be used for the circuit diagram having a minimum configuration, of the electronic circuit.

The present invention is a circuit information generating apparatus that includes a base module including a signal processing unit and an extension module that is connected with the base module and serves a specific function, and generates information indicating a configuration of an electronic circuit made by connecting at least one extension module with the base module. The circuit information generating apparatus includes a switching section that switches wiring between the base module and the extension module based on wiring information that defines connection between the base module and the extension module, an address acquisition section that acquires identification information of the extension module connected with the base module, a wiring information acquisition section that acquires the wiring information, a firmware acquisition section that acquires firmware that operates the extension module, a wiring information rewriting section that identifies circuit configuration information of each extension module based on the identification information, and rewrites a part of the wiring information based on the circuit configuration information, a circuit information generating section that generates circuit information that serves as abase of a circuit diagram illustrating the configuration of an electronic circuit based on the circuit configuration information of the extension module connected with the base module and the rewritten wiring information, and a firmware generating section that rewrites definition information regarding the wiring between the extension module and the base module, the definition information being included in the acquired firmware, based on the rewritten wiring information and generates new firmware.

BRIEF DESCRIPTION OF DRAWINGS

FIG. 5 is a function block diagram illustrating an example of function configurations of hardware that executes a circuit information generating program according to the present invention;

FIG. 6 is a diagram illustrating an example of a part of firmware used when the circuit information generating program is executed;

FIG. 7 is a function block diagram illustrating function configurations of the circuit information generation program;

FIG. 8 is a flowchart illustrating an example of a flow of an operation of the circuit information genarating program;

FIG. 9 is an example of CAD data exemplarily illustrating circuit diagram data generated by the circuit information genarating program;

FIG. 11 is a diagram illustrating a detailed example of a part of firmware used when the circuit information genarating program is executed;

FIG. 12 is a diagram illustrating an example of specific firmware generated by the circuit information genarating program;

DESCRIPTION OF THE PREFERRED EMBODIMENTS

Embodiments to which the present invention is applied will be described with reference to the drawings. Hereinafter, first, an embodiment of an experimental production tool that is operated as a circuit information generating apparatus by execution of a circuit information generating program by a signal processing unit of a base module will be described. Next, an embodiment of a circuit information generating system in which an experimental production tool and a server execute respective programs to generate circuit information will be described.

Configuration 1 of Hardware

Figure 1:
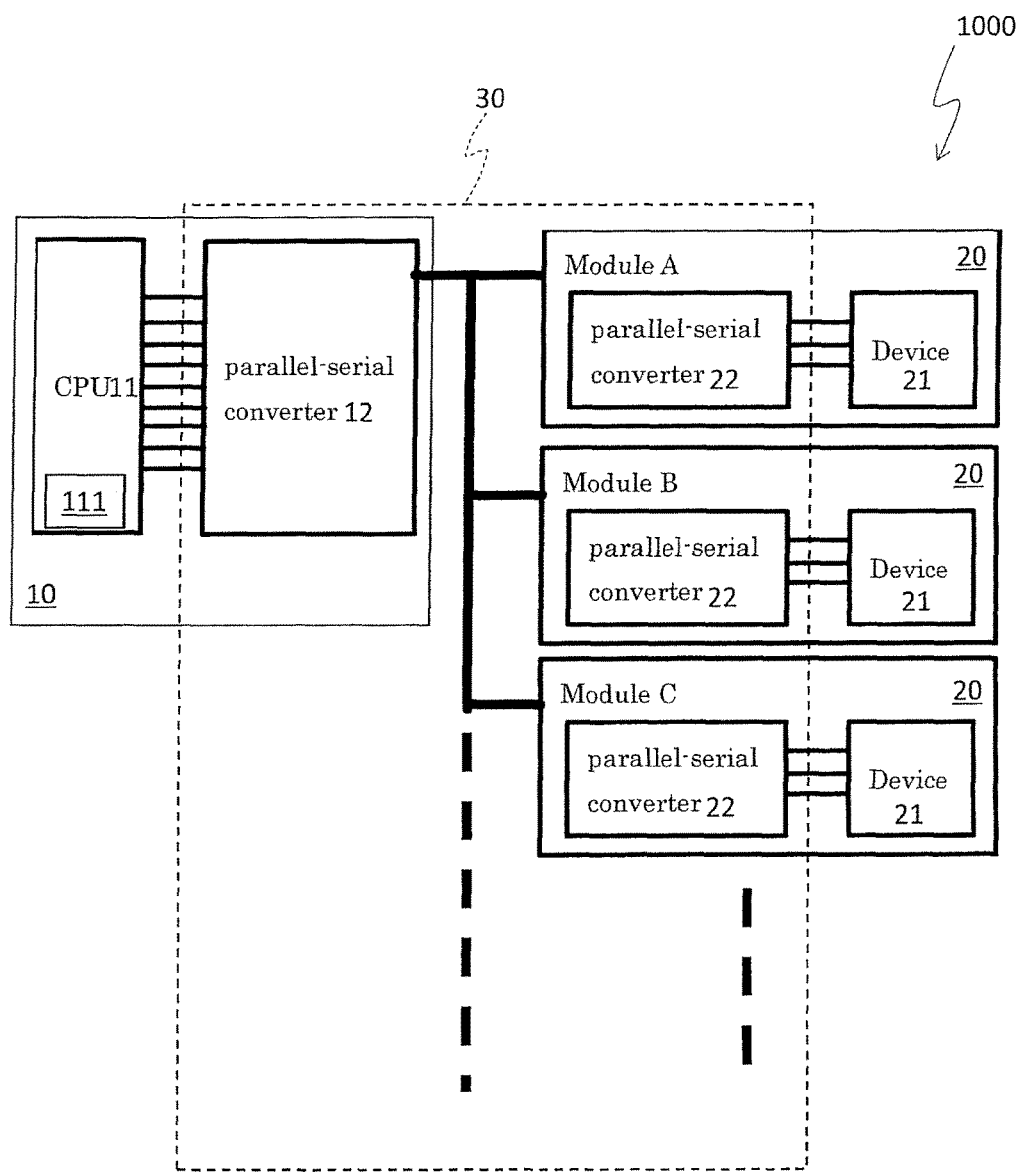
FIG. 1 is a block diagram illustrating an example of a hardware configuration that executes a circuit information generating program according to the present invention.

First, an example of a hardware configuration that executes a circuit information generating program according to the present embodiment will be described. An experimental production tool 1000 as a circuit information generating apparatus illustrated in FIG. 1 is a hardware resource used as an experimental production tool of an electronic circuit. In the present embodiment, the circuit information generating program is computer software executed in the experimental production tool 1000.

The experimental production tool 1000 includes a base module 10 including a signal processing unit, extension modules 20, each of which includes a device 21 that is a specific function unit, and a wiring module 30 that switches wiring that connects the base module 10 and the extension modules 20.

The base module 10 includes a CPU 11 that is the signal processing unit and a first signal converter 12 that configures a part of the switching section that switches the wiring for terminals of the CPU 11.

A memory 111 as a storage unit is mounted inside the CPU 11. In the memory 111, the circuit information generating program executed by the CPU 11, a data group including definition to be used by the circuit information generating program, and the like are stored. Further, in the memory 111, firmware for operating various external devices including the extension modules to be connected to the CPU 11 is stored. This firmware is a part of a program library of the CPU 11, and is rewritten upon execution of the circuit information generating program, as described below. Rewritten new firmware is also stored in the memory 111.

Note that the circuit information generating program may be stored in an external storage unit, instead of being stored in the memory 111 inside the CPU 11. Further, the circuit information generating program may be configured as software executed on a web server connected to the Internet. Further, data to be used in execution of the circuit information generating program, new firmware and data to be generated by execution of the circuit information generating program may be stored on the web server. That is, the circuit information generating program according to the present embodiment may just be configured from software in cooperation with the hardware resources that can execute processing and processing required for preparation of the processing. Description of embodiments in the present specification is given based on the aforementioned configuration.

The experimental production tool 1000 switches the wiring between the base module 10 and the extension modules 20 to configure an electronic circuit serving a specific function. To be more specific, the experimental production tool 1000 is a device that assists experimental production of a desired electronic circuit, by switching the wiring between the CPU 11 of the base module 10 and the devices 21 of the extension modules 20 by the wiring module 30, and configuring an electronic circuit that performs desired signal processing and a desired control operation. Further, the experimental production tool 1000 has a role as a circuit information generating apparatus that generates information (circuit diagram information and new firmware) indicating a configuration of an experimentally produced electronic circuit, as described below.

The first signal converter 12 has, for example, a parallel-serial conversion function or a serial-parallel conversion function, and an operation thereof is controlled by the CPU 11 that has executed the circuit information generating program. The first signal converter 12 performs parallel-serial conversion processing for various parallel signals output from the terminals of the CPU 11, and outputs the generated serial signals to the extension modules 20. Further, the first signal converter 12 performs parallel-serial conversion processing for parallel signals output from the extension modules 20 to generate serial signals, and converts the generated serial signals into parallel signals and inputs the parallel signals to the CPU 11. Alternatively, the CPU 11 can operate the experimental production tool with the serial signal without through the signal converter 12. In this case, the CPU 11 may just perform processing for allocating terminals to input/output terminals of the extension modules 20 later.

Each of the extension modules 20 includes the device 21 operated to serve a part or all of the specific function based on the control of the CPU 11 that has executed the circuit information generating program and a second signal converter 22 that configures a part of the switching section. Each of the extension modules 20 includes address information (a module address) as identification information. The module address is transmitted (output) from the extension module 20 to the CPU 11 based on the control of the CPU 11. The module address is typically received (acquired) by the CPU 11 at initialization in the program operation or at use of individual extension module 20. Other timing to transmit the module address from the extension module 20 to the CPU 11 will be described below. The device 21 executes a predetermined operation and processing according to the control of the CPU 11. Further, the device 21 outputs information obtained through the predetermined operation or processing to the CPU 11.

The second signal converter 22 also has a parallel-serial conversion function or a serial-parallel conversion function, for example, and an operation of the second signal converter 22 is controlled by the CPU 11 that has executed the circuit information generating program. The second signal converter 22 performs parallel-serial conversion processing for various parallel signals output from terminals of the device 21 to generate serial signals, and outputs the generated serial signals to the base module 10. Further, the second signal converter 22 performs serial-parallel conversion processing for a serial signal from the base module 10 to generate a parallel signal, and inputs the generated parallel signal to the device 21.

The wiring module 30 is a communication section, and is controlled by the CPU 11 that has executed the circuit information generating program. The wiring module 30 dynamically switches the wiring that connects the terminals of the CPU 11 and the terminals of the devices 21 based on wiring information. Note that the wiring information is information that defines connection states of the base module 10 and the extension modules 20. To be more specific, the wiring information is information that defines the terminals of the base module and the terminals of the devices mounted on the extension modules, and defines the connection states between the terminals.

In FIG. 1, the wiring module 30 is exemplarily illustrated as a circuit that performs serial communication. Note that the wiring module 30 in the experimental production tool 1000 is not limited to this example. The wiring module 30 can be configured using a high-speed communication bus that is a wired communication line. Alternatively, the wiring module 30 can be configured using a wireless channel and a wireless communication line.

FIG. 1 exemplarily illustrates a state in which the three extension modules 20 are connected to the base module 10. However, the number of the extension modules 20 connected to the base module 10 is arbitrary. The number of connections of the extension modules 20 becomes larger than three, depending on the specification of the base module 10. To experimentally produce the electronic circuit, at least one extension module 20 may just be connected to the base module 10.

Note that a hardware configuration of the circuit information generating apparatus that can execute the circuit information generating program according to the present embodiment is not limited to the experimental production tool 1000 exemplarily illustrated in FIG. 1. The hardware of the circuit information generating apparatus may just has at least the "signal processing unit (section)", and the "specific function unit (section)" connected with and in cooperation with the signal processing unit to serve the specific function. Further, the hardware of the circuit information generating apparatus may just include a "wiring switching unit (section)" having a function to dynamically change the connection between the signal processing unit and the specific function unit according to a command of the circuit information generating program, and a function to switch the state of the connection (wire connection) between the signal processing unit and the specific function unit. The hardware of the circuit information generating apparatus may just be able to execute processing for exerting the above-described various functions.

Configuration 2 of Hardware

Next, another example of a hardware configuration of an experimental production tool as a circuit information generating apparatus will be described. An experimental production tool 1001 illustrated in FIG. 2A includes a plurality of base modules 101 and extension modules 201 individually connected to the respective base modules 101. Each of the extension modules 201 includes a unique device 21. The devices 21 (a device A, a device B, and a device C) are wired and connected, on a one-to-one basis, with CPUs 11 of the base modules 101 that control respective signal processing and operations. Further, the devices 21 (the devices A to C) are mutually connected through a wireless line and are configured to serve a specific function in cooperation with one another. In this example, electronic circuits in which the CPUs 11 and the devices 21 are combined on a one-to-one basis are connected through the wireless line, thereby to connect the CPUs 11 in a mesh manner.

Figure 2A:
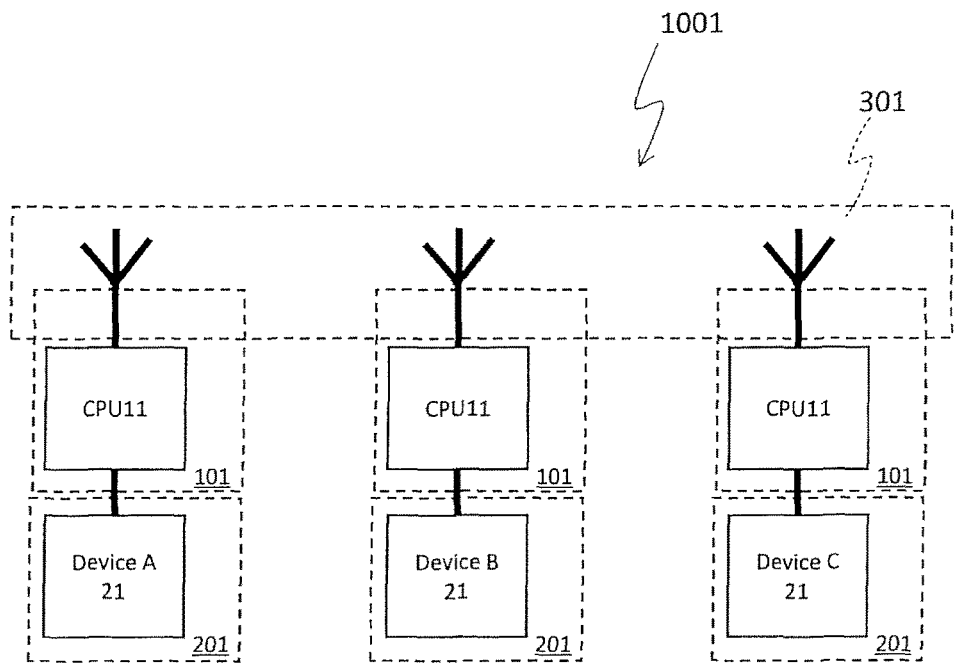
FIGS. 2A and 2B are block diagrams illustrating other examples of the hardware configuration.

The experimental production tool 1001 illustrated in FIG. 2A controls the extension modules 201 that serve as a part of the specific function by the individual CPUs 11, thereby to connect the extension modules 201 through a wiring module 301 that is the wireless line. Therefore, according to the experimental production tool 1001, an electronic circuit having a wireless connection function can be experimentally produced.

Figure 2B:
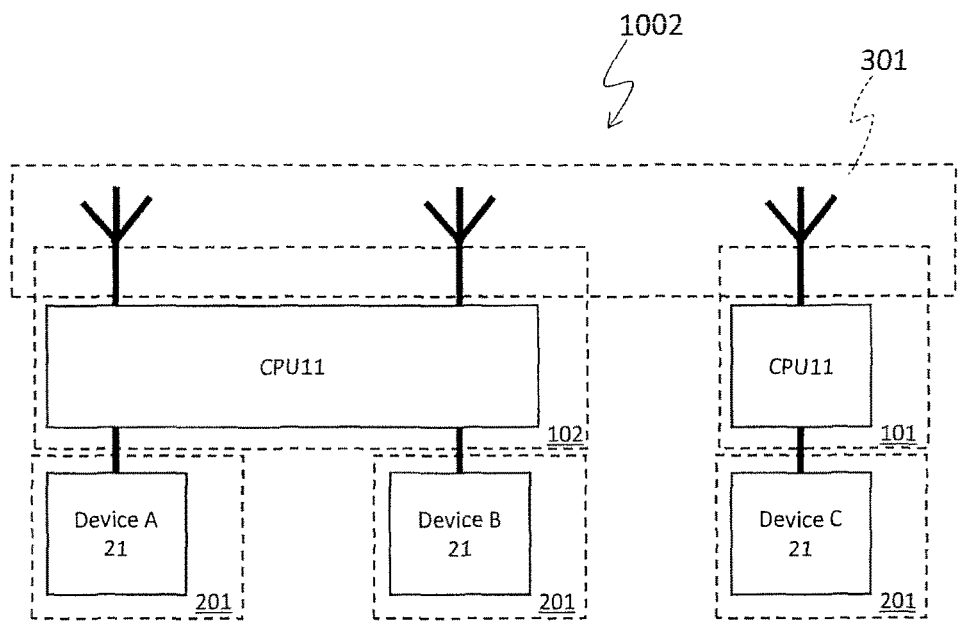

An experimental production tool 1002 illustrated in FIG. 2B has a configuration in which the two base modules 101 illustrated in FIG. 2A are replaced with one base module 102. The base module 102 is configured to connect a plurality of devices 21 to one CPU 11. In the experimental production tool 1002, the base module 102 is connected with another base module 101 through a wiring module 301 that is a wireless line.

Further, as illustrated in FIGS. 2A and 2B, the experimental production tools 1001 and 1002 can cause a plurality of the CPUs 11 to function as a single signal processing unit through a wireless communication line. That is, the experimental production tools 1001 and 1002 can cause a part or all of a plurality of distributed CPUs 11 to function as a single CPU (signal processing section). Therefore, these experimental production tools 1001 and 1002 serve the function of the experimental production tool 1000 illustrated in FIG. 1, that is, a function similar to the configuration in which the plurality of extension modules 20 is connected to one CPU 11. Further, a plurality of the base modules 10 to which the extension modules 20 are connected is connected and is caused to work in conjunction with one another, thereby to obtain a configuration serving the specific function. Hereinafter, when description is given using any of the experimental production tools 1000, 1001, and 1002 as a representative example, the same applies to other experimental production tools, and description thereof is omitted.

Configuration 3 of Hardware

Next, still another example of a hardware configuration of an experimental production tool as a circuit information generating apparatus will be described. An experimental production tool 1003 illustrated in FIG. 3 uses an electronic switch group for a wiring switching section.

A base board 570 in the experimental production tool 1003 corresponds to the base module 10 in the experimental production tool 1000, and an extension board 580 corresponds to the extension module 20.

Figure 3:
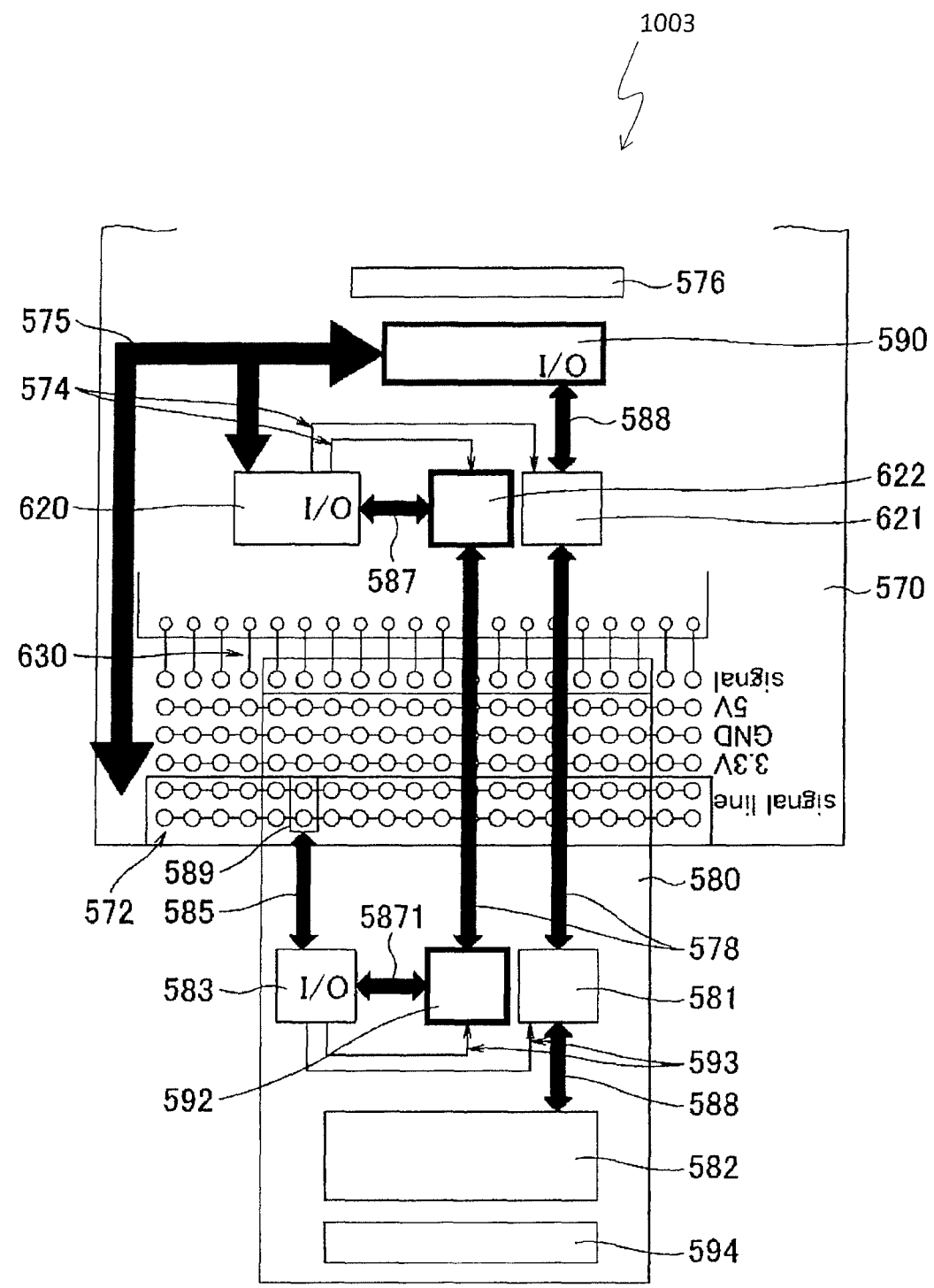
FIG. 3 is a block diagram illustrating still another example of the hardware configuration.

In FIG. 3, the base board 570 includes a microcomputer 590 that is a signal processing unit, a switching control circuit 620, a switching circuit 621, and a switching circuit 622 that configure a switching section. Further, the base board 570 includes a display unit 576. The extension board 580 is connected to the base board 570 with a connector 630.

Note that, as the switching control circuit 620, an I/O expander or the like can be used.

The extension board 580 includes a specification determination section 583, a switching circuit 581 and a switching circuit 592 that configure a switching section, and a device group 582 serving a specific function. Note that the extension board 580 also includes a display unit 594.

All of the microcomputer 590, the switching control circuit 620, and the specification determination unit 583 are connected with a signal bus 575, a signal bus 572, and a signal bus 585 like beads.

The base board 570 can be electrically connected with the extension board 580 through the connector 630. Connection between the base board 570 and the extension board 580 is performed by disabling the switching circuit 621 and enabling the switching circuit 622 with the switching control circuit 620 arranged in the base board 570. By disabling the switching circuit 621 and enabling the switching circuit 622, an input/output terminal I/O of the switching control circuit 620 of the base board 570 and an input/output terminal I/O of the specification determination unit 583 of the extension board 580 can be electrically connected. In this state, by causing the input/output terminal I/O of the switching control circuit 620 to be an input state, and receiving a connector connection position confirmation signal from the specification determination unit 583 on the extension board 580, a connection position of the extension board 580 can be confirmed.

As another configuration, input/output directions of the input/output terminal I/O of the specification determination unit 583 of the extension board 580 and the input/output terminal I/O of the switching control circuit 620 of the base board 570 are reversed, and the output signal of the base board 570 is received at the extension board 580 side. Then, this signal may be transmitted to the microcomputer 590 of the base board 570 through a communication bus.

Further, similarly to the example illustrated in FIG. 1, the experimental production tool 1003 can connect a plurality of the extension boards 580 to the base board 570. As another configuration, if connection positions are mutually confirmed among the extension boards, the extension boards 580 can be connected in multi-stages, that is, the extension boards 580 can be directly connected. In this case, a larger-scale circuit information generating apparatus can be constructed.

The experimental production tool 1003 is operated as follows based on control of the microcomputer 590 that has executed a circuit information generating program. First, the microcomputer 590 transmits/receives a signal to/from the extension board 580, the signal for confirming connection relationship between the input/output terminal I/O of the specification determination unit 583 on the extension board 580 and the input/output terminal I/O of the switching control circuit 620 of the base board 570. Accordingly, the microcomputer 590 confirms the connection position of the extension board 580, for each address. If the extension board 580 is correctly connected, the microcomputer 590 displays information indicating the correct connection in the display unit 576 of the base board 570, and in the display unit 594 of the extension board 580.

First control lines 574 are signal lines through which control signals of the switching control circuit 620 that controls the switching circuits 621 and 622 in the base board 570 are transmitted. Second control lines 593 are signal lines through which control signals of the specification determination unit 583 that controls the switching circuits 581 and 592 in the extension board 580 are transmitted.

Control signals transmitted to the signal buses 575 and 585 for controlling the specification determination unit 583 and the switching control circuit 620 connected to the microcomputer 590 are the same signals. Further, the microcomputer 590 controls the switching circuits 621, 622, 592, and 581 using the signal bus 578, the specification determination unit 583, and the switching control circuit 620.

The above-described control by the microcomputer 590 corresponds to control for switching two connection states of the switching circuit 592 and the switching circuit 622 through a signal bus 587, a signal bus 578, and a signal bus 5871. One of the connection states by the control is a state for connecting the input/output terminal I/O of the specification determination unit 583 and the input/output terminal I/O of the switching control circuit 620. Further, the other of the connection states is a state for connecting the microcomputer 590 and the device group 582 of the extension board 580 through the signal buses 588 and 578 by the switching circuit 581 and the switching circuit 621.

In FIG. 3, an input/output terminal for receiving a position signal of the extension board 580 may be separately provided at the base board 570 side, and the input/output terminal is connected to the input/output terminal of the base board 570, and a terminal to be connected to the input/output terminal of the specification determination unit 583 may be provided at the extension board 580 side. In doing so, the position of the extension board 580 can be automatically determined even if there are no switching circuit 622 at the base board 570 side and no switching circuit 592 at the extension board 580 side. Further, if the number and the type of the terminals of the extension modules, the module addresses of the extension modules, and various types of information for using the circuits of the extension modules are sent from the specification determination unit 583 through the signal in accordance with attaching positions, a more precise operation can be realized.

By use of the above-described experimental production tool 1003, an easier operation and confirmation can be performed while the extension board 580 is arbitrarily attached/removed to/from the base board 570, and a large number of combinations of the base board and the extension boards is randomly tried. Accordingly, the experimental production of the electronic circuit serving the specific function can be more easily and efficiently performed.

The circuit information generating program can be executed and the experimentally produced electronic circuit can be operated by using any of the experimental production tool 1000, the experimental production tool 1001, the experimental production tool 1002, and the experimental production tool 1003 described above. Further, the information (circuit diagram information) that enables generating of the circuit diagram of the experimentally produced electronic circuit can be automatically generated by execution of the circuit information generating program using the experimental production tools. Further, according to the experimental production tools, firmware that can be used for the operation of the experimentally produced electronic circuit can be easily generated. Note that new firmware generated by the experimental production tool that has executed the circuit information generating program is called "specific firmware" for being distinguished from the firmware used before the generation.

Procedure of Experimental Production

Figure 4:
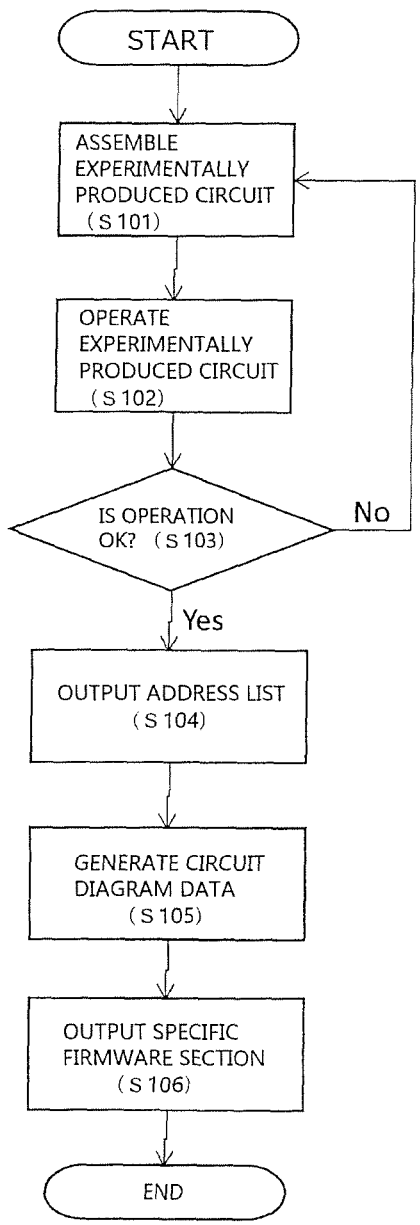
FIG. 4 is a flowchart illustrating an example of a procedure for experimentally producing an electronic circuit using any of the aforementioned hardware configurations.

Next, an example of a procedure for executing the circuit information generating program to experimentally produce the electronic circuit will be described. This procedure is based on the case of using the experimental production tool 1004 illustrated in FIG. 5. The experimental production tool 1004 illustrated in FIG. 5 is an example of a conceptually simplified experimental production tool 1000, 1001, 1002, or 1003 described above. Note that some differences are caused in the processing procedure of the circuit information generating program depending on the characteristic of the tool. Therefore, the differences of the procedure depending on the tools will be described in appropriate description positions. As illustrated in the flowchart of FIG. 4, first, a combination of extension modules 5020 required to configure an electronic circuit that exerts an objective function is selected, the extension modules are attached to a base module 5010, and an electronic circuit to be experimentally produced (hereinafter, referred to as experimentally produced circuit) is assembled (S101).

Next, the experimentally produced circuit is operated using the experimental production tool 1004, the firmware, and an application programming interface (API) (S102). If the operation of the experimentally produced circuit is not the objective operation (expected operation) (No in S103), the experimentally produced circuit is assembled again (S101).

If the operation of the experimentally produced circuit is the objective operation (Yes in S103), an execution button on a user interface screen (not illustrated) is selected by a user, for example, and processing below is performed by a CPU 5011 in S104. The CPU 5011 acquires the module addresses that are the identification information of the extension modules 5020 attached to the base module 5010 from the respective extension modules 5020, and generates and outputs a module address list that is a list of the acquired module addresses (S104). An output destination of the module address list is a memory 5111 of the CPU 5011 included in the base module 5010, for example. The output module address list is a data group configured from address information that can uniquely identify the extension modules 5020.

Next, the CPU 5011 identifies circuit diagram data corresponding to the address information of the extension modules 5020 included in the module address list, and allocates terminals of the CPU 5011 to the circuit diagram data to generate circuit diagram data with fixed wiring (S105). The processing for identifying the circuit diagram data by the CPU 5011 is, for example, to store a database in which the module addresses of the extension modules 5020 and the circuit diagram data of the extension modules 5020 are associated with each other in the memory 5111 or the like in advance, and to identify the circuit diagram data corresponding to the module addresses acquired in S104. The CPU 5011 stores the generated circuit diagram data in the memory 5111, for example. Note that, as described above, the circuit diagram data and the program for generating the circuit diagram may be stored in a storage unit that is a separate body from the CPU 5011. Further, the data and the program may be stored in a server arranged on the Internet.

Next, the CPU 5011 rewrites the firmware used in 5102 to accord with the circuit diagram data generated in S105, that is, the circuit diagram data to which the terminals of the CPU 5011 are allocated and fixed (S106). This rewritten new firmware becomes the specific firmware. The generated specific firmware is stored in the memory 5111 of CPU 5011. Note that the generated specific firmware may be stored in a storage unit separately provided from the CPU 5011. In this case, the specific firmware may be stored in a web server arranged on the Internet.

As described above, according to the experimental production tool 1004 that has executed the circuit information generating program, after an operation of an electronic circuit temporarily configured from a base module and one or more extension modules is confirmed, the circuit information (circuit diagram data) necessary for production of the electronic circuit and the specific firmware can be automatically generated. That is, according to the experimental production tool 1004 as a circuit information generating apparatus, the circuit diagram data to be used to produce the circuit diagram for mass production configured as minimally as possible without unnecessary components such as the switch group and the serial-parallel convertor used in the tool can be automatically generated. Further, according to the experimental production tool 1004, the specific firmware to be used to configure the electronic circuit can be automatically generated.

Function Configuration Example of Circuit Information Generating Program

Next, the circuit information generating program executed by the circuit information generating apparatus will be described with reference to FIGS. 5 to 12. The experimental production tool 1004 illustrated in FIG. 5 conceptually includes the above-described experimental production tools 1000, 1001, 1002, and 1003. The experimental production tool 1004 has a configuration in which the CPU 5011 and devices 5021 are connected through a wiring module 5030. The wiring module 5030 is a switching section, and is controlled by the CPU 11 that has executed a program 100 as the circuit information generating program. The wiring module 5030 may just be controlled by the CPU 5011 as a substantial terminal that switches and connects connection between the CPU 5011 and the devices 5021. Therefore, as the wiring module 5030, various communication methods such as parallel communication, serial communication, re-wiring bus switching, and wireless means can be used. The CPU 5011 includes a plurality of signal terminals 5013 to be used for input/output of signals. The device 5021 is a module, a plurality of which is connectable to the CPU 5011. Each of the devices 5021 includes a plurality of function terminals 5023 to be connected to the signal terminals 5013 of the CPU 5011.

Data, which is used when the CPU 5011 executes processing based on the program 100, is stored in the memory 5111 of the CPU 5011 in advance. The data stored in the memory 5111 of the CPU 5011 is the firmware, the address information used when the CPU 5011 detects and identifies the devices 5021, relative terminal numbers for identifying the function terminals 5023 at the time of wiring the signal terminals 5013 and the function terminals 5023, and the like. Note that the address information and the relative terminal numbers may be stored in a storage unit that is a separate body from the CPU 5011. In this case, the data may be stored in a server connected to the Internet.

In FIG. 5, the signal terminals 5013 of the CPU 5011 are made of nine terminals including GPIO 01, GPIO 02, . . . , and GPIO 09. These nine signal terminals 5013 are general-purpose input/output terminals. The signal terminals 5013 are connected with the device 5021, and configure an interface that exchanges the control signal from the CPU 5011 to the device 5021, the signal from the device 5021 to the CPU 5011, and the like.

Further, in FIG. 5, the function terminals 5023 of the device 5021 are made of three terminals including Signal 1, Signal 2, and Signal 3. Note that an environment where the program 100 is executed described below does not limit the number of the devices 5021 to be connected to the CPU 5011 to three. Further, the number of the function terminals 5023 included in each of the devices 5021 is not limited to three.

Next, the firmware used for the operation of the experimental production tool 1004 will be described. In this example, the firmware is stored in the memory 5111 of the CPU 5011. However, the firmware can be stored in an external storage medium of the CPU 5011. In the firmware, information and a command required for control of the wiring for connecting the CPU 5011 and the devices 5021 are described as definition information. FIG. 6 illustrates an example of a part of the definition information included in the firmware. Definition information 121 illustrated in FIG. 6 is made of the address information and information for defining the relative terminal number.

As illustrated in FIG. 6, a "#define" command included in the definition information 121 defines the terminals (signal terminals 5013) included in the CPU 5011.

Portions described in "Module_A=" and "Module_B=" define a class, an instance, a structural body, and the like used in the program 100. With the definition, the program 100 can use the "Module_A" and the "Module_B" as variables for identifying the devices 5021. The "Module_A" and the "Module_B" correspond to the address information of the devices 5021 and the wiring information of the devices 5021.

A program function "set_IOs ( )" included in the definition information 121 is a command that specifies wiring states corresponding to the respective function terminals 5023 of the devices 5021 to be allocated to any of the terminals of the CPU 5011 defined in the aforementioned # define. With this command, how the signal terminals 5013 included in the CPU 5011 are wired to the function terminals 5023 is specified for the respective devices 5021 distinguished as the "Module_A" and the "Module_B".

Connection of the signals (the Signals 2 and 3) having the same definition are switched by an enable signal or a bus switch, and the signals are used for the devices 5021 distinguished as the "Module_A" and the "Module_B". In a case where the signals having the same definition uses a common bus, the switching processing may not be necessary.

Next, function configurations of the program 100 that is an example of the circuit information generating program executed by the circuit information generating apparatus according to the present invention will be described. As illustrated in FIG. 7, the program 100 includes an extension module detection section 110, a wiring operation section 120, an extension module connection section 130, an address list acquisition section 140, a circuit information generation section 150, and a specific firmware generation section 160. In other words, the CPU of the circuit information generating apparatus executes the program 100, thereby to function as the extension module detection section 110, the wiring operation unit 120, the extension module connection section 130, the address list acquisition section 140, the circuit information generation section 150, and the specific firmware generation section 160.

The extension module detection section 110 executes processing for detecting and identifying the positions of the extension modules 5020 connected to the physical terminals (signal terminals 5013) included in the base module 5010. Note that, in the experimental production tools 1000, 1001, and 1002, the position detection processing is not necessary, and the positions can be arbitrarily programmatically specified.

The wiring operation section 120 executes processing for operating the wiring module 5030 to wire (dynamically re-wire) the CPU 5011 and the devices 5021 based on the definition of the wiring described in the definition information 121. Note that, in the experimental production tools 1000, 1001, and 1002, such dynamic re-wiring is not necessary, and can be arbitrarily programmatically performed.

The extension module connection section 130 executes control for causing the extension modules 5020 to be connection states or non-connection states for the CPU 5011, or processing for enabling or disabling the control. The extension module connection section 130 notifies the device 5021 that becomes the connection state for the CPU 5011 of an enable signal (Enable), and notifies the device 5021 that becomes the non-connection state for the CPU 5011 of a disable signal (Disable).

The address list acquisition section 140 executes processing for acquiring the address information (module address list) of the extension modules 5020 detected by the extension module detection section 110.

The circuit information generation section 150 reads the circuit information of the extension modules 5020 stored in the memory 5111 of the CPU 5011 based on the acquired module address list. The circuit information generating section 150 rewrites the names and the like of the terminals indicated in the read circuit information based on the definition information 121. The circuit information generating section 150 stores the rewritten circuit information in the memory 5111 of the CPU 5011.

The specific firmware generation section 160 rewrites the definition information 121 based on the circuit information rewritten in the circuit information generation section 150. Here, the rewritten definition information 121 reflects the wiring state between the CPU 5011 and the devices 5021, and thus is information required to configure and operate the experimentally produced electronic circuit. The specific firmware generation section 160 generates the firmware including the rewritten definition information 121. The firmware generated here is referred to as specific firmware.

Example of Processing of Circuit Information Generating Program

Next, an example of a flow of circuit information generating processing by the program 100 having the function configurations illustrated in FIG. 7 will be described with reference to the flowchart of FIG. 8. In FIG. 8, steps of the processing are written as S110, S111, S112, and the like.

When the necessary extension modules 5020 are attached to the base module 5010 and the program 100 is executed in the experimental production tool 1004, first, the CPU 5011 reads the definition information 121 from the memory 5111 (S110). In a case where the definition information 121 is included in the program 100, the CPU 5011 moves onto the next processing without executing the definition information reading processing.

Next, the CPU 5011 defines information related to the terminals of the CPU 5011 and the devices 5021, names of relative terminals, the address information that identifies the extension modules 5020, based on the read definition information 121 (S111).

Next, the CPU 5011 executes processing for detecting the attaching positions of the extension modules 5020 to the base module 5010 using the defined address information (S112). At this time, the CPU 5011 detects the respective attaching positions of the extension modules 5020 attached to the base module 5010. Note that this processing for detecting the attaching positions (S112) is arbitrary processing in the experimental production tool 1000, the experimental production tool 1001, and the experimental production tool 1002. The reason for the arbitrary processing is that there is no problem even if the attaching positions of the extension modules 5020 are not involved when the program 100 is executed using the aforementioned tools.

Next, the CPU 5011 controls the wiring module 5030 to execute processing for changing the wiring between the signal terminals 5013 (GPIO 01, GPIO 02, . . . , GPIO 09) and the function terminals 5023 based on the content defined in the definition information 121 (S113). With the processing, the signal terminals 5013 of the CPU 5011 and the function terminals 5023 of the devices 5021 are re-wired. This processing is arbitrary processing in the experimental production tools 1000, 1001, and 1002 that do not require re-wiring. The experimental production tools 1000, 1001, and 1002 that do not require re-wiring correspond to a state in which the wiring module 5030 does not make any distinction according to a serial communication bus, communication between CPUs, or wired or wireless means.

Next, the CPU 5011 executes processing for connecting the re-wired devices 5021 to the base module 5010 (S114). With the processing (S114), the electronic circuit configured from the base module 5010 and the extension modules 5020 becomes an operable state. Next, the electronic circuit is operated for confirming whether the operation serving the specific function can be obtained by the connection between the base module 5010 and the extension modules 5020 and the combination (S115). In S115, the user performs final evaluation as to whether the desired circuit has been completed with the experimentally produced configuration. Note that, in 5115, a part of the operation and the evaluation of the electronic circuit may be automatically performed.

When the operation serving the specific function cannot be confirmed regarding the experimentally produced electronic circuit (No in S115), the configurations of the extension modules 5020 to be experimentally produced and an operation program are changed based on the fact that the experimental production has not yet been completed (S116). The "operation program" here is a program arbitrarily created by the user and is different from the above-described firmware. S116 is performed by the user, and after the configurations of the extension modules 5020 to be experimentally produced are changed, the processing from S110 is executed by the CPU 5011 again.

When the operation serving the specific function regarding the experimentally produced electronic circuit is confirmed and the experimental production is completed (Yes in S115), the CPU 5011 generates and output the module address list that is the list of the address information (module addresses) of the extension modules 5020 connected to the base module 5010, and has been defined in 5111 (S117). In 5117, the output destination of the module address list is the memory 5111 of the CPU 5011. Alternatively, the module address list may be output to an internal memory of a separately attached processor or an external storage device.

Next, the CPU 5011 moves onto processing of 5118, and generates the circuit diagram data as follows. First, the CPU 5011 identifies the circuit diagram data corresponding to the respective extension modules 5020, and reads the circuit diagram data from the memory 5111 of the CPU 5011 based on the module address list generated in S117. The CPU 5011 rewrites the relative terminal numbers corresponding to the configuration of the electronic circuit, the operation of which has been already confirmed, with the names of the signal terminals 5013 of the CPU 5011. With the processing for rewriting the terminal numbers, the wiring between the CPU 5011 and the devices 5021 is determined, and the circuit diagram data of the experimentally produced electronic circuit is determined, that is, the circuit diagram data (circuit diagram information) having the minimum configuration without the wiring module 5030 is generated. The CPU 5011 stores the generated circuit diagram data in the memory of the CPU 5011. Alternatively, the CPU 5011 may store the generated circuit diagram data in an internal memory of a separately attached processor or an external storage device. The circuit diagram data stored in this way becomes data that can be used by screen display or printing or in editing work with a CAD when the experimentally produced circuit diagram is produced. Therefore, by use of the circuit diagram data, the circuit diagram required to experimentally produce the electronic circuit can be created.

Next, the CPU 5011 generates the specific firmware based on the circuit diagram data generated in 5118, and stores the generated firmware in the memory 5111 of the CPU 5011 (S119). Alternatively, in 5119, the CPU 5011 may store the generated firmware to an internal memory of a separately attached processor or an external storage device. This specific firmware is firmware that can be used to operate the electronic circuit based on the above-described circuit diagram data.

Example of Circuit Diagram Data

Next, the circuit diagram data generated in 5118 by execution of the program 100 by the CPU 5011 will be described. FIG. 9 illustrates an example of CAD data that displays the circuit diagram data as a drawing. CAD data 91 illustrated in FIG. 9 has the CPU 5011 arranged on the right side on the sheet surface, and the devices 5021 arranged on the left side on the sheet surface. As illustrated in FIG. 9, in the CAD data 91 generated by execution of the program 100, wiring that connects the signal terminals 5013 of the CPU 5011 and the function terminals 5023 of the devices 5021 has a one-to-one relationship. In the circuit diagram data that is circuit configuration information that is a base of the CAD data 91, a circuit scale is also defined in advance. Therefore, the CAD data 91 is generated such that a portion (display region) illustrating the CPU 5011 and a portion illustrating the devices 5021 do not overlap with each other. The CAD data 91 generated by rewriting the terminal numbers and illustrated in FIG. 9 indicates a configuration of an actual electronic circuit. Note that various common buses may be shared by a plurality of the devices 5021.

Figure 10:
FIG. 10 is a diagram illustrating an example of definition information used by the circuit information genarating program.

Next, the specific firmware generated in 5119 described above by execution of the program 100 by the CPU 5011 will be described. First, a detailed example of the definition information 121 used by the program 100 is illustrated in FIG. 10, and an example of the firmware is illustrated in FIG. 11. The definition information 121 illustrated in FIG. 10 is an example of a source code using more detailed information than the already-described example. Note that FIG. 10 exemplarily illustrates a case of using python script in description of the definition information 121.

The information defined in the definition information 121 is as follows. First, the relationship between the terminal numbers of the CPU 5011 and the functions in the terminals of the CPU 5011 is described from the comment sentence "#SPI bus" to "NC=0".

Next, the terminal numbers of the terminals of the CPU 5011 are stored in an array io as elements, where the array name is "io", and definition of an input terminal and an output terminal are abstracted using the array io. The input terminal is defined as a variable "inpin", and an output terminal is defined as a variable "outpin". Note that "pcbOutput" and "pcbInput" are not used in the experimental production stage.

An example of the firmware to which the function terminals 5023 of the devices 5021 are allocated based on the definition information 121 illustrated in FIG. 10 is illustrated in FIG. 11. The firmware illustrated in FIG. 11 uses a "getWiring function" that is called using the address information of the extension module 5020 as an argument. If the getWiring function is called using specific address information as the argument, relative wiring information of the extension module 5020 corresponding to the address information can be acquired. The case of FIG. 11 illustrates a state in which (five) extension modules 5020 with the address information corresponding to "1" to "5" are connectable to the base module 5010.

By execution of the program 100 using the definition information 121 exemplarily illustrated in FIG. 10 and the firmware exemplarily illustrated in FIG. 11, the specific firmware exemplarily illustrated in FIG. 12 is generated. As illustrated in FIG. 12, only the extension modules 5020 with the address information corresponding to "1", "3", and "4" are connected to the base module 5010.

As illustrated in FIG. 12, by use of the address information of the extension module 5020 as an argument of the "getWiring function", the specific firmware can also acquire the wiring information fixed to the extension module 5020 corresponding to the address information. In this case, as firmware for operating the electronic circuit regarding the circuit diagram generated using the circuit diagram data illustrated in FIG. 9, the electronic circuit can be operated using the above-described wiring information as it is. The other experimental production tools can also be similarly set.

The above-described program 100 can be used for the experimental production tool having a hardware configuration that is any of the above exemplarily described configurations, that is, the program 100 can cause the experimental production tool to be operated and functioned as the circuit information generating apparatus. The program 100 and the experimental production tool may be any program and experimental production tool as long as those can collect the addresses of the extension modules 5020 connected to the base module 5010 and the firmware with defined wiring, and rewrite the name of the wiring included in the circuit diagram data and the definition of the wiring by the firmware.

According to the experimental production tool as the circuit information generating apparatus that has executed the program 100 as described above, the circuit information serving as a base of the circuit diagram for mass production having the minimum configuration without the wiring module 5030 can be automatically generated, for the electronic circuit for mass production, which is generated through the experimental production stage. Further, the above-described experimental production tool 1004 can generate the circuit diagram and the firmware by connecting one CPU 5011 to only a part of the extension modules 5020 without connecting the remaining extension modules 5020 to the CPU 5011. In this case, the extension modules to be connected to the CPU 5011 can be freely combined.

Further, the program 100 can cause the experimental production tool 1004 to automatically generate a circuit diagram of an electronic circuit having a configuration that connects one or more extension modules to a plurality of CPUs including the CPU 5011. In this case, processing for partially dividing the experimentally produced electronic circuit to a circuit including one CPU 5011 is possible. Linkage of the firmware at that time may be performed such that an instruction is output from a part of the CPUs 5011 in a unified manner, or a unified instruction may be output from a CPU of a separate personal computer or mobile terminal. Alternatively, what is to be done can be instructed and determined in advance for each of the CPUs connected to the extension modules. If the wiring between the CPUs 5011 and the devices 5021 is determined, the wiring information thereof may just be reflected. That is, the wiring information may just be abstracted.

Further, in a case of the circuit in which the plurality of CPUs 11 is distributed, like the experimental production tool 1001 or the experimental production tool 1002 described in FIGS. 2A and 2B, only a part of the CPUs 11 is arbitrarily connected to a plurality of devices 21 (refer to FIG. 2B), and the circuit diagram and the firmware can be generated. On the other hand, the circuit diagram and the firmware generated through the form illustrated in FIG. 2B are re-connected to a single CPU (refer to FIG. 2A), and generation of the circuit diagram and the firmware can be arbitrarily realized. Further, for example, a circuit diagram and firmware that causes the CPU 11 to be wirelessly connected to a device A, and the CPU 11 to be connected to a device B in a wired manner can be generated.

Therefore, by use of the circuit information generating apparatus, development cost can be reduced, and rapid prototyping of the electronic circuit can be easily performed. Therefore, the circuit information generating apparatus can be effectively used for startup or development of IoT instruments that require the rapid prototyping.

Next, still other embodiments of a circuit information generating program and a circuit information generating apparatus will be described with reference to FIGS. 13 and 14. The experimental production tool 1004 and the program 100 described above are executed in a so-called stand-alone manner. On the other hand, the embodiment described below is a network-type system configuration.

Another Configuration Example

Figure 13:
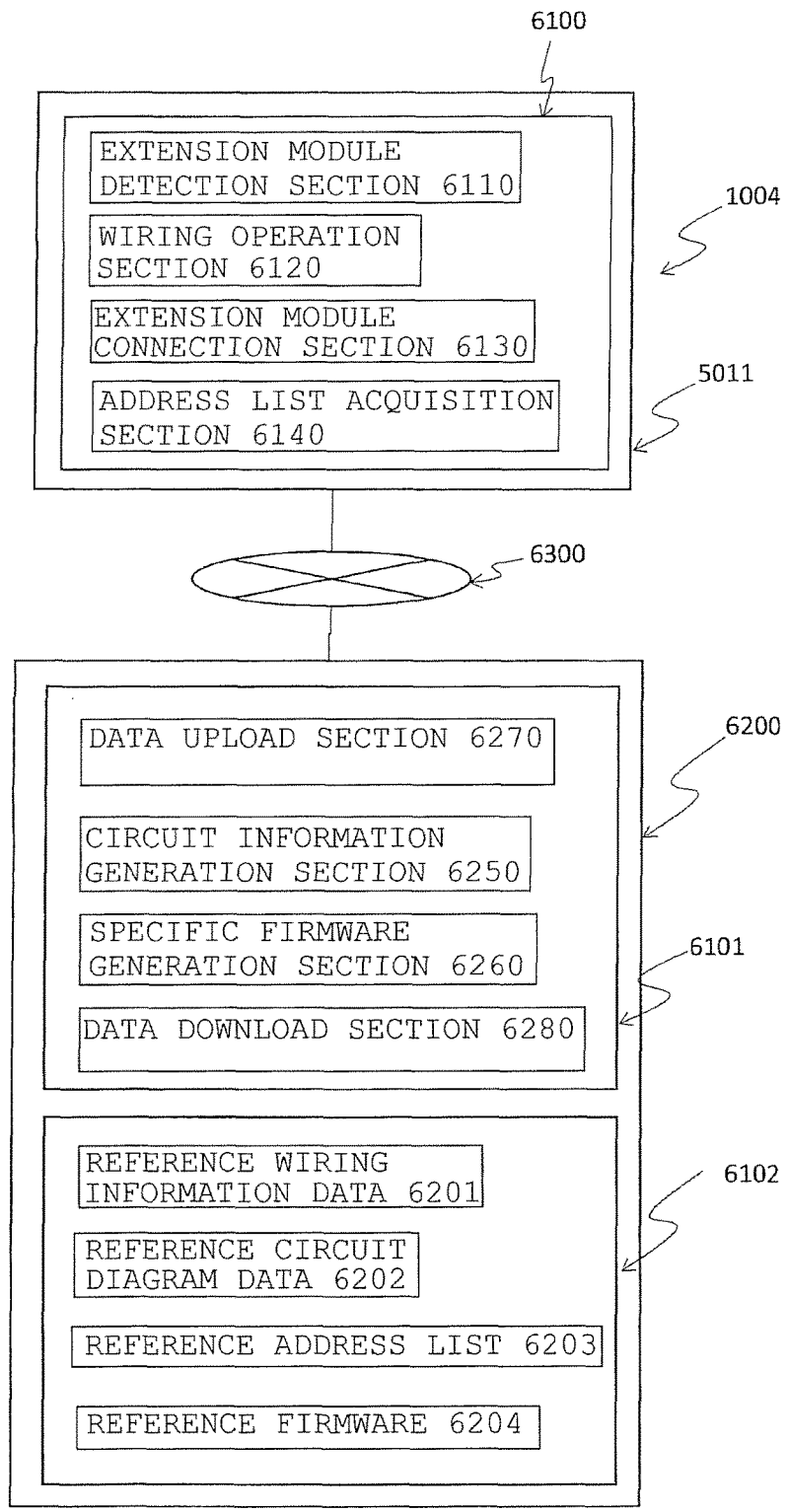
FIG. 13 is a function block diagram illustrating another example of function configurations of the circuit information genarating program.
Figure 14:
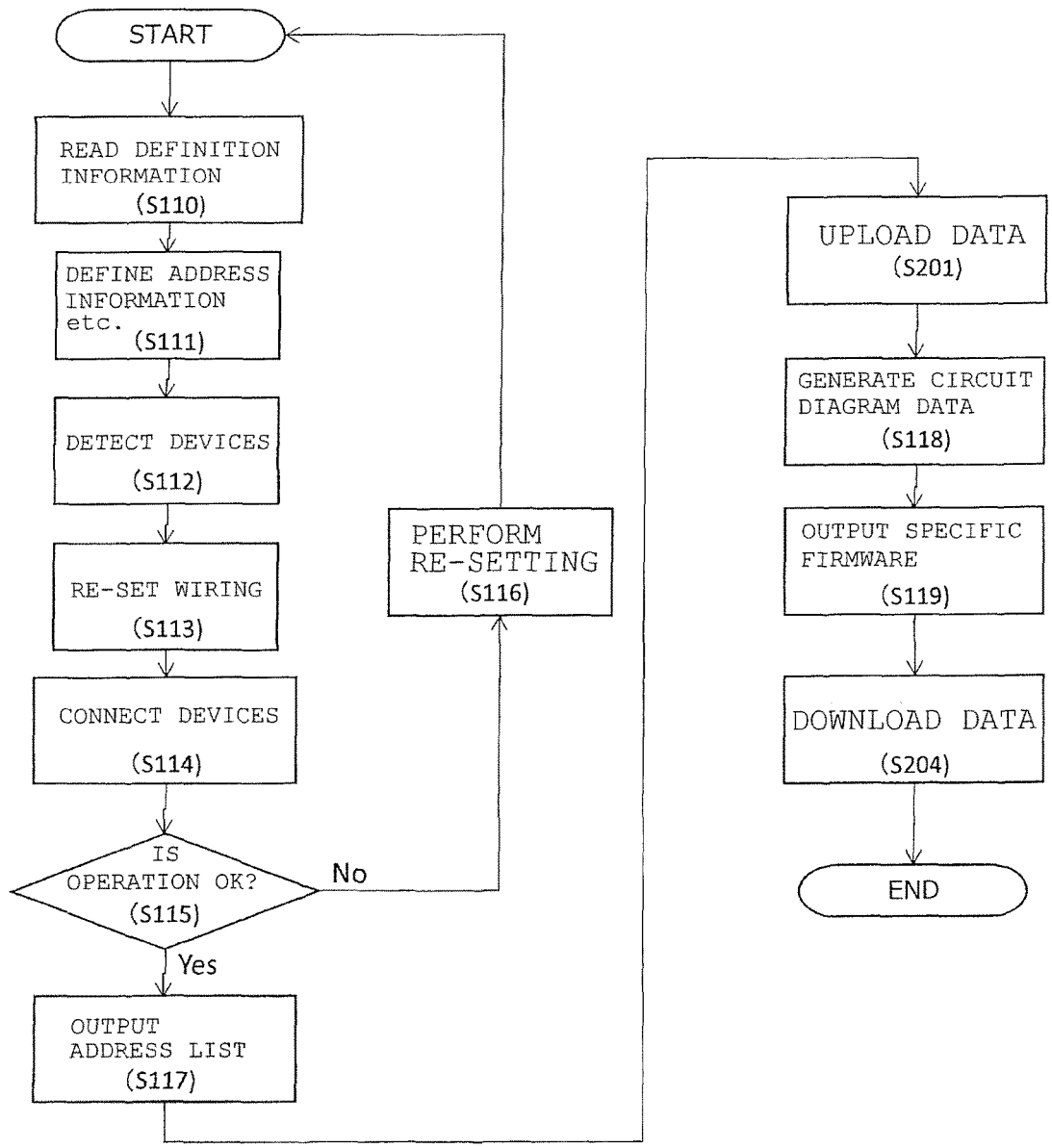
FIG. 14 is a flowchart illustrating another example of a flow of an operation of the circuit information genarating program.

As illustrated in FIG. 13, in the present embodiment, a circuit information generating system is configured from an experimental production tool 1004 in which a client program 6100 is executed and a server 6200 in which a server-side program 6101 is executed. The experimental production tool 1004 is an electronic circuit in which a base module and extension modules are connected, as described above. In addition, in the present embodiment, the experimental production tool 1004 has a CPU 11 of the base module communicatively connected with the server 6200 through a network 6300.

The client program 6100 is a program based on the already-described program 100, and is executed with the server-side program 6101 executed on the server 6200. As illustrated in FIG. 13, the client program 6100 includes a wiring operation section 6120, an extension module connection section 6130, and an address list acquisition section 6140. In other words, a CPU 5011 of the experimental production tool 1004 executes the client program 6100, thereby to cause the experimental production tool 1004 to function as the wiring operation section 6120, the extension module connection section 6130, and the address list acquisition section 6140.

The server-side program 6101 includes a data upload section 6270, a circuit information generation section 6250, a specific firmware generation section 6260, and a data download section 6280. In other words, a CPU of the server 6200 executes the server-side program 6101, thereby to cause the server 6200 to function as the data upload section 6270, the circuit information generation section 6250, the specific firmware generation section 6260, and the data download section 6280. Further, in the server 6200, a data group 6102 that is basic data to be appropriately referred by the server-side program 6101 is stored. The data group 6102 is made of, for example, reference wiring information data 6201, reference circuit diagram data 6202, a reference address list 6203, and reference firmware 6204.

An extension module detection section 6110, the wiring operation section 6120, the extension module connection section 6130, and the address list acquisition section 6140 that configure the client program 6100 illustrated in FIG. 13 are equivalent to the functions exerted by the execution of the program 100 described above. Therefore, detailed description thereof is omitted.

Note that the server 6200 is a web server, for example, and the server-side program 6101 is written in a script language such as PHP.

The data group 6102 may be taken in from an outside of the server 6200, or may be stored by the CPU 5011 of the experimental production tool 1004. Further, the data group 6102 may be uploaded from the experimental production tool 1004 to the server 6200 at necessary processing timing. Further, the firmware used in the CPU 5011 or data edited based on the firmware may be used as reference data.

Another Example of Processing of Circuit Information Generating Program

An example of a flow of processing when a client program 6100 and a server-side program 6101 having the above-described configurations are executed will be described. The flowchart illustrated in FIG. 14 illustrates processing steps as S110, S111, and the like. Processing that is the same as the processing of the already-described program 100 is denoted with the same reference numerals and signs, and detailed description is omitted.

When the client program 6100 is executed in an experimental production tool 1004, a CPU 5011 of the experimental production tool 1004 reads definition information 121 from a memory 5111 (S110), and executes the above-described series of processing. As a result, the CPU 5011 acquires address information (module addresses) of extension modules 5020 connected to a base module 5010, generates a module address list that is a list of the extension modules, and outputs the list to a predetermined storage medium (for example, a memory 5111) (S117).

Next, the module address list generated by the experimental production tool 1004 is uploaded to a server 6200 through a data upload section 6270 (S201). This processing of 5201 is performed while the experimental production tool 1004 and the server 6200 perform communication, that is, the processing is performed by the CPU 5011 of the experimental production tool 1004 and a CPU of the server 6200 in cooperation with each other. Further, various data may be uploaded from the CPU 5011 of the experimental production tool 1004 to the server 6200 through various external devices. In addition, if the firmware and the wiring information to be referred by the server 6200 are stored in the experimental production tool 1004 side, such information may be uploaded to the server 6200 in S201 at the same time.

Next, the circuit diagram data generation processing (S118) is executed at the server 6200 side. In S118, the server 6200 identifies a circuit diagram from address numbers included in the module address list, and generates circuit diagram data as described in FIG. 9, which associates wiring between the CPU 5011 and devices 5021. The server 6200 outputs (stores) the generated circuit diagram data to a storage device in the server 6200, for example.

Further, the server 6200 generates reference firmware 6204 based on the definition information 121 exemplarily illustrated in FIG. 10 by the firmware output processing (S119), and executes appropriate rewriting in the specific firmware generation section 6260. As a result, specific firmware exemplarily illustrated in FIG. 12 is generated. The server 6200 outputs (stores) the generated specific firmware to a storage device in the server 6200, for example.

Next, the circuit diagram data and the specific firmware generated by the server 6200 are downloaded to the experimental production tool 1004 through a data download section 6280 (S204). This processing of S204 is performed while the experimental production tool 1004 and the server 6200 perform communication, that is, the processing is performed by the CPU 5011 of the experimental production tool 1004 and the CPU of the server 6200 in cooperation with each other. Alternatively, the processing of S204 can be downloaded to a communication terminal other than the experimental production tool 1004 or various types of external equipments of the server 6200.

In the above-described example, processing for searching the address list for the reference data and matching the terminals of the extension modules with the signal terminals of the CPU 5011 has been described. However, the processing is not limited to the example. For example, even when the address list is not uploaded and only the wiring information of the extension modules 5020 is uploaded, the wiring information can be rewritten and similar data to the above description can be generated if modules to be referred are known. That is, what patterns the wiring is connected with the CPU 5011 is known, the wiring between the CPU 5011 and the devices 5021 can be made as the circuit diagram data and the specific firmware.

Note that the processing executed in the server-side program 6101 may be generated with a computer language, such as Javascript, which can be processed at a local side. Further, the processing may be performed as distributed processing on a cloud. Further, the processing executed in the server-side program 6101 may be executed through a special local application or may be executed with a simple local application.

What is claimed is:

1. A circuit information generating apparatus including a base module, which includes a signal processing unit, and an extension module, which is connected with the base module and serving a specific function, and generating information indicating a configuration of an electronic circuit made by connecting the base module with at least one extension module, the circuit information generating apparatus comprising:

a switching section configured to switch wiring between the base module and an extension module of the at least one extension module based on wiring information that defines a connection state between the base module and the extension module;

an address acquisition section configured to acquire identification information of the extension module connected with the base module;

a wiring information acquisition section configured to acquire the wiring information;

a firmware acquisition section configured to acquire firmware that operates the extension module;

a wiring information rewriting section configured to identify circuit configuration information of each extension module based on the identification information, and rewrite a part of the wiring information based on the circuit configuration information;

a circuit information generating section configured to generate circuit information serving as a base of a circuit diagram illustrating the configuration of an electronic circuit based on the circuit configuration information of the extension module connected to the base module and the rewritten wiring information; and a firmware generating section configured to rewrite definition information regarding the wiring between the extension module and the base module, the definition information being included in the acquired firmware, based on the rewritten wiring information, and generate new firmware.

2. The circuit information generating apparatus according to claim 1, wherein the switching section includes a connection section configured to connect the base module and the extension module, and a connection state control section configured to enable or disable the connection section.

3. The circuit information generating apparatus according to claim 2, wherein the connection section is a wired communication line that connects the base module and the extension module with a common bus.

4. The circuit information generating apparatus according to claim 2, wherein the connection section is a wireless communication line that connects the base module and the extension module with a wireless channel.

5. The circuit information generating apparatus according to claim 1, configured to generate information indicating the configuration of an electronic circuit that connects a plurality of base modules to which an extension module is connected and causes the plurality of base modules to work in conjunction with one another to serve a specific function.

6. A circuit information generating system including an electronic circuit made by connecting a base module and an extension module, and a server connected with the electronic circuit through a communication network, wherein the switching section, the address acquisition section, and the wiring information acquisition section according to claim 1 are arranged at a side of hardware configured from the base module and the extension module, and the firmware acquisition section, the wiring information rewriting section, the circuit information generating section, and the firmware generating section according to claim 1 are arranged at a side of the server.

* * * * *